United States Patent [19]
Park et al.

[11] Patent Number: 5,675,538
[45] Date of Patent: Oct. 7, 1997

[54] NON-VOLATILE SEMICONDUCTOR MEMORY DEVICE HAVING A REFERENCE VOLTAGE APPLIED TO A SENSE LINE AFTER DATA READ OUT IS COMPLETE

[75] Inventors: Jong-Min Park, Suwon; Young-Joon Choi, Seoul, both of Rep. of Korea

[73] Assignee: Samsung Electronics Co., Ltd., Suwon, Rep. of Korea

[21] Appl. No.: 570,870

[22] Filed: Dec. 12, 1995

[30] Foreign Application Priority Data

Dec. 12, 1994 [KR] Rep. of Korea ............... 33725/1994

[51] Int. Cl.$^6$ ....................................... G11C 11/40
[52] U.S. Cl. ..................... 365/185.25; 365/185.12; 365/185.13
[58] Field of Search ............... 365/185.12, 185.13, 365/185.25, 204, 185.02, 185.23

[56] References Cited

U.S. PATENT DOCUMENTS

| | | |
|---|---|---|
| 4,677,590 | 6/1987 | Arakawa ............... 365/185.12 |
| 4,785,424 | 11/1988 | Lin et al. ............... 365/204 |
| 4,933,906 | 6/1990 | Terada et al. ............... 365/204 |

*Primary Examiner*—David C. Nelms
*Assistant Examiner*—Vu A. Le
*Attorney, Agent, or Firm*—Cushman Darby & Cushman, IP Group of Pillsbury Madison & Sutro LLP

[57] ABSTRACT

Disclosed is a memory device which includes a memory cell array having a plurality of bit lines arranged in parallel, a plurality of word lines electrically insulated and crossed with the bit lines, and a plurality of memory cells connected with corresponding bit lines. Each of the memory cells has at least one floating gate memory transistor. A reference voltage generator generates a reference voltage that is applied to a sense line which corresponds to a selected word line that is selected when data is read out. Further, the present invention advantageously provides a discharging transistor that discharges the reference voltage on the sense line selected when the reading operation is complete in order to prevent application of a voltage to the floating gate of the memory cell for a period of time which is longer than necessary. As a result, undesired changes in the threshold voltage are minimized.

9 Claims, 4 Drawing Sheets

NON-VOLATILE SEMICONDUCTOR MEMORY DEVICE HAVING A REFERENCE VOLTAGE APPLIED TO A SENSE LINE AFTER DATA READ OUT IS COMPLETE

BACKGROUND OF THE INVENTION

1. Field of the Invention

The present invention relates to an electrically erasable and programmable non-volatile memory device and, more particularly, to a circuit which prevents erroneous data read out in memory cells of a non-volatile memory device.

2. Description of the Related Art

In electrically erasable and programmable read only memory devices (hereinafter, referred to as an "EEPROM"), reduced dimension memory cells have been used so that integration density of the EEPROM can be improved. One method to reduce the size of the memory cell is to use a MOSFET (metal oxide semiconductor field effect transistor) which has a floating gate formed on a channel region with a gate insulating film formed therebetween and a control gate formed over the floating gate through an interlayer insulating film as a memory cell transistor.

FIG. 1 is a schematic block diagram showing a conventional EEPROM and FIG. 2 is a timing diagram showing waveforms of various signals appearing in the EEPROM of FIG. 1. As shown in FIG. 1, the EEPROM comprises at least one memory cell array. The memory cell array comprises a plurality of bit lines arranged in parallel, a plurality of word lines electrically insulated from and crossing the bit lines, and a plurality of memory cells connected with corresponding bit lines. Each of the memory cells comprises at least one memory transistor. The memory transistor comprises a control gate connected with a corresponding word line and a floating gate for storing electrical charge.

In such an EEPROM, reading operations of data stored in memory cells takes place as follows. The power voltage source is applied to selected word lines and a ground voltage source is applied to non-selected word lines. To a sense line connected to the control gate of a memory transistor, a constant voltage, i.e. a reference voltage, is applied. Data from the memory transistor can thus be read out using a sense amplifier.

Hereinafter, a read operation from a memory transistor will be described with reference to FIGS. 1 and 2.

The transition of an address signal shown by "A" of FIG. 2 can initiate a real operation. Address transition detectors 4 and 8 respectively receive output signals of address buffers 2 and 6, and generate address transition pulse (hereinafter, referred to as "ATP") signals shown by "B" and "C" of FIG. 2. Strobe generator 10 produces an address transition strobe (hereinafter, referred to as "ATS") signal when an ATP signal is generated. Pulse generator 16 receives the ATS signal and generates two signals, one of which is $\phi_{sa}$ shown by "E" of FIG. 2 and the other of which is $\phi_{latch}$ shown by "F" of FIG. 2. The signals $\phi_{sa}$ and $\phi_{latch}$ are applied to a sense amplifier 28 and an output buffer 30, respectively.

The signal $\phi_{sa}$ is provided to activate the sense amplifier 28 during the time required to sense data using the sense amplifier 28, and the signal $\phi_{latch}$ is provided to latch the data read out by the sense amplifier.

Upon initiation of a reading operation, with the address signal being transitioned as shown by "A" of FIG. 2, the word line WL corresponding to the address signal "A" is selected by decoder 12 and a column selecting transistor 26 is selected decoder 14. When the power voltage source is applied to the selected word line WL, the voltage on the word line WL is applied to a gate of word line selecting transistor 22, which has a drain connected to the bit line BL and a source connected to a drain of word line selecting transistor 24. A reference voltage from a reference voltage generator 18 is applied to a gate of the transistor 24 through the transfer transistor 20 and a sense line SL. The gate and drain of the transfer transistor 20 are connected to the word line WL and the sense line SL, respectively, and a source thereof is connected with the reference voltage generator 18. The reference voltage to the sense line SL is provided to read out data stored in the memory transistor 24 by erasing and programming the floating gate.

With reference to FIG. 2, the word line WL signal is applied only when an address signal is generated as shown in FIG. 2H, but a reference voltage is continuously applied to the transfer transistor 20 on the sense line SL. If the signal on the word line WL appears due to generation of a corresponding address signal, the sense line SL, to which the reference voltage has already been applied, is at a floating state and is not influenced by other voltage signal when in a floating state. When the voltage on word line WL is reduced to indicate the end of the read operation, the reference voltage on the sense line SL slowly discharges due to leakage and the like, but it takes between several seconds to several tens of seconds to drop to a ground voltage. In "J" of FIG. 2, a reference symbol T1 indicates the interval when the sense line SL is in a floating state prior to ground voltage.

When the reference voltage signal is applied to the sense line SL, an electric field between the drain and gate of the memory transistor 24 is caused, and therefore Fowler-Nordheim tunnelling occurs. The Fowler-Nordheim tunnelling causes a charge gain phenomenon that injects electrons into the floating gate of the memory transistor 24, and undesirably changes the threshold voltage of the cell from a negative voltage to a positive voltage. The change in the threshold voltage is increased in proportion to the time required for carrying out the read operation during which the sense line SL is continuously on. As a result, the threshold voltage is moved to a level that is equal or greater than the reference voltage applied to the sense line SL. When this occurs, the memory cell is changed to a non-programmed cell state from its desired programmed state. Thus, such a conventional EEPROM can erroneously perform read operations.

SUMMARY OF THE INVENTION

It is an object of the present invention to provide a non-volatile memory device which is capable of preventing erroneous data read out from memory cells.

According to the object of the present invention, the invention is directed to a non-volatile memory device in which, after detection of data corresponding to a specific address, a reference voltage is not applied to a sense line of the memory cell, and the sense line is grounded to prevent occurrences of erroneous data read out from memory cells of the device.

The memory device according to the present invention includes a memory cell array having a plurality of bit lines arranged in parallel, a plurality of word lines electrically insulated and crossed with the bit lines, and a plurality of memory cells connected with corresponding bit lines. Each of the memory cells has at least one floating gate memory transistor. A reference voltage generator generates a reference voltage that is applied to a sense line which corresponds to a selected word line that is selected when data is read out. Further, the present invention advantageously provides a discharging transistor that discharges the reference voltage on the sense line selected when the reading operation is complete in order to prevent application of a voltage to the floating gate of the memory cell for a period of time which is longer than necessary. As a result, undesired changes in the threshold voltage are minimized.

The EEPROM according to the invention is therefore capable of enabling, at the completion of a read operation, a corresponding sense line to discharge to a ground voltage.

BRIEF DESCRIPTION OF THE DRAWINGS

This invention will be better understood and its object will become more apparent to those skilled in the art by reference to the following detailed description of the preferred embodiment that refers to the following accompanying drawings.

DESCRIPTION OF THE PREFERRED EMBODIMENT

Figure 1:
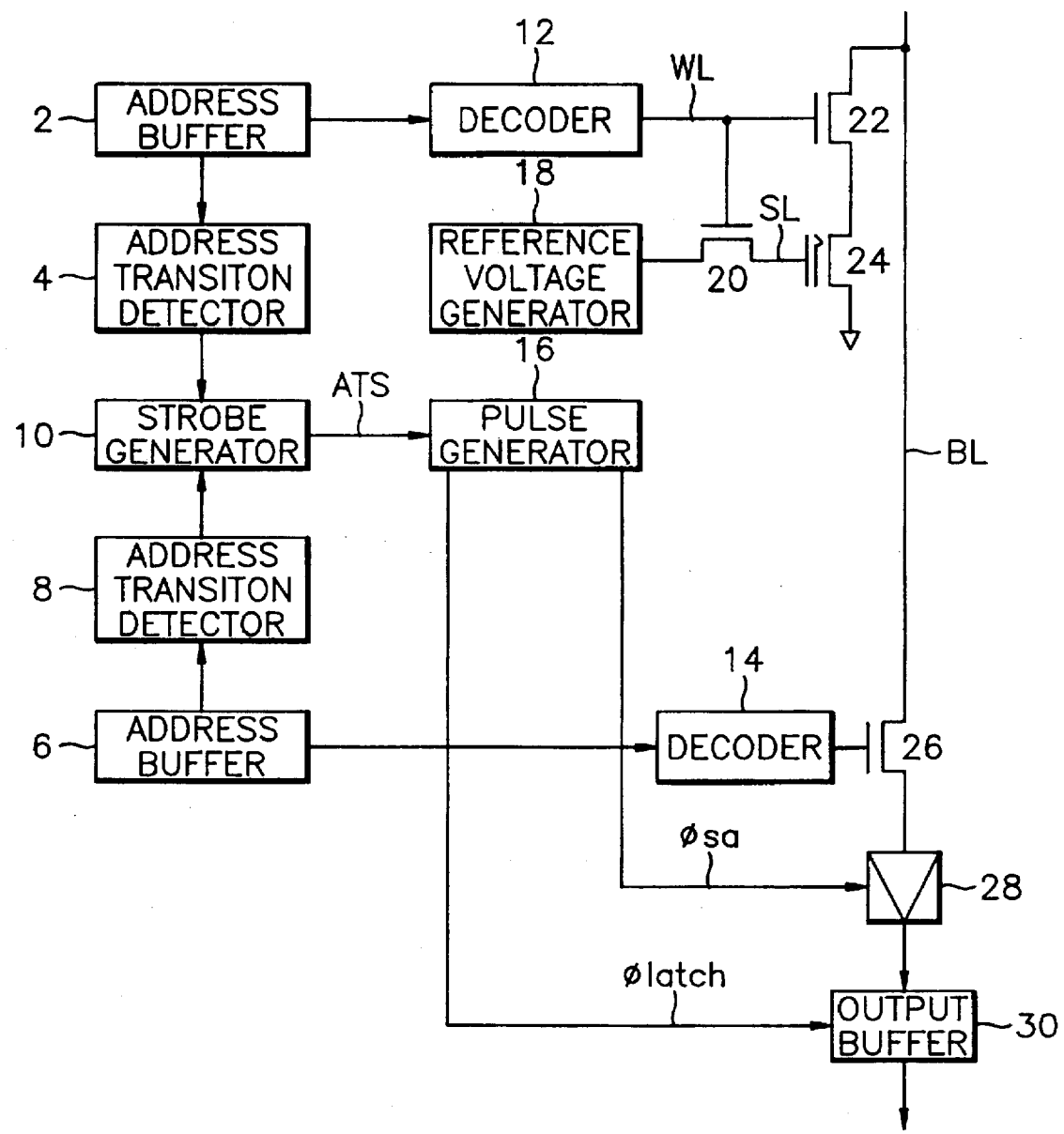
FIG. 1 is a schematic block diagram showing a conventional EEPROM.
Figure 2:
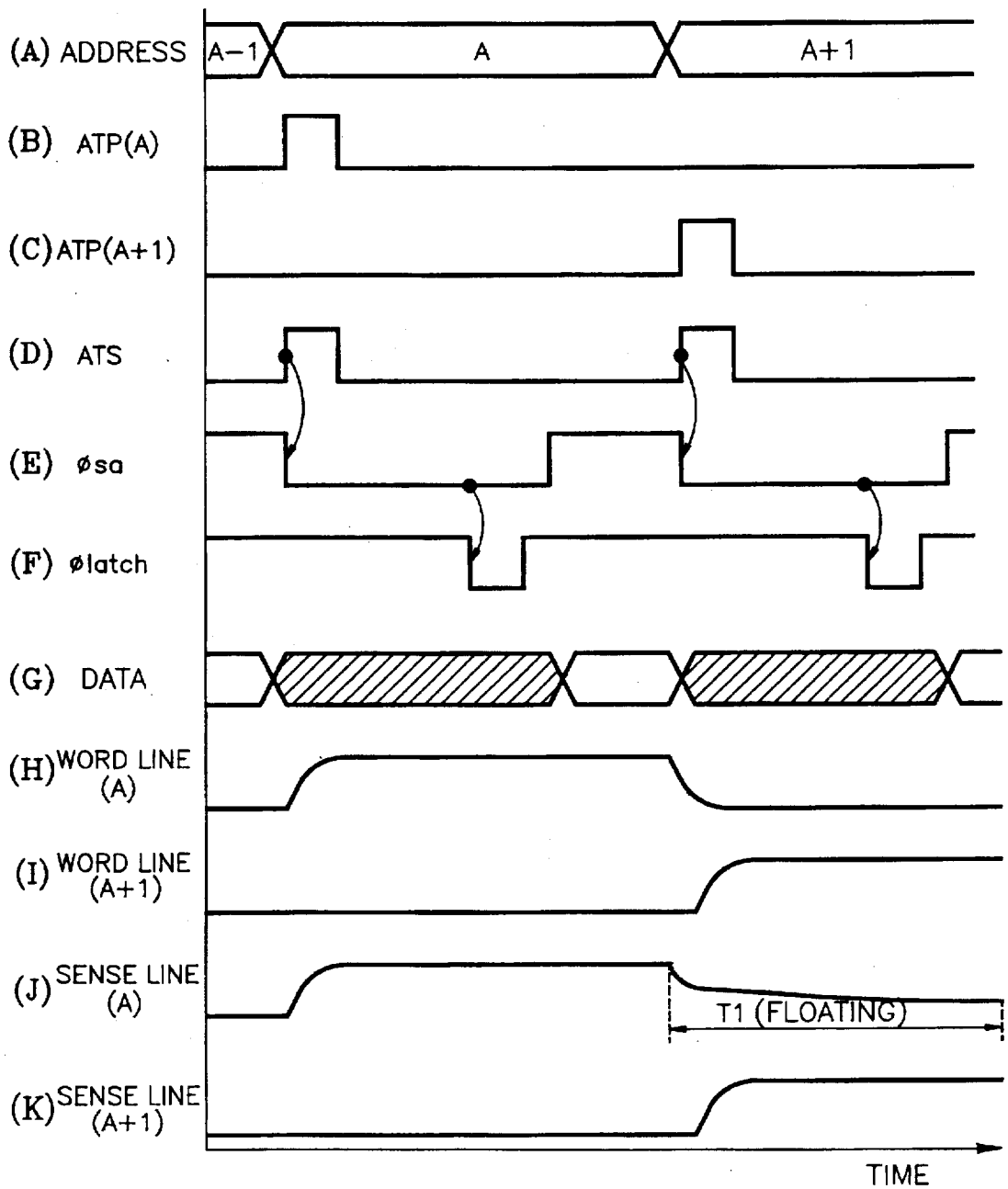
FIG. 2 is a timing diagram showing waveforms of various signals appearing in the EEPROM of FIG. 1.
Figure 3:
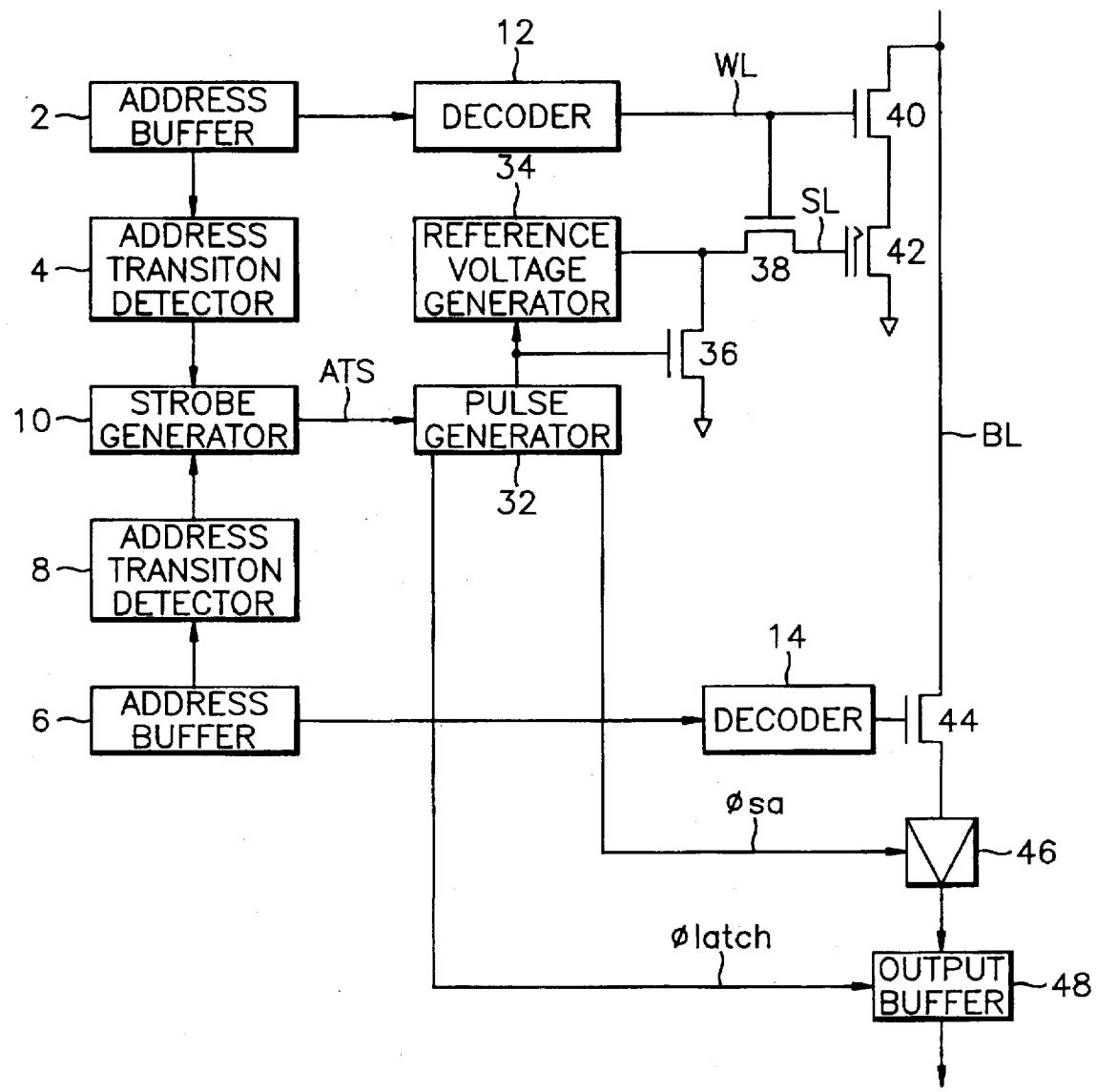
FIG. 3 is a schematic block diagram showing an EEPROM according to the present invention.

Referring to FIG. 3, the novel EEPROM in accordance with the present invention identifies a structure similar to that of FIG. 1 with similar reference labels. Pulse generator 32 produces signal $\phi_{dis}$ (shown in FIG. 4) in addition to the signals $\phi_{sa}$ and $\phi_{latch}$ that are applied to sense amplifier 46 and the output buffer 48 respectively. Discharging transistor 36 is connected between the drain of the transfer transistor 38 and ground to perform a discharging function in response to signal $\phi_{dis}$.

Figure 4:
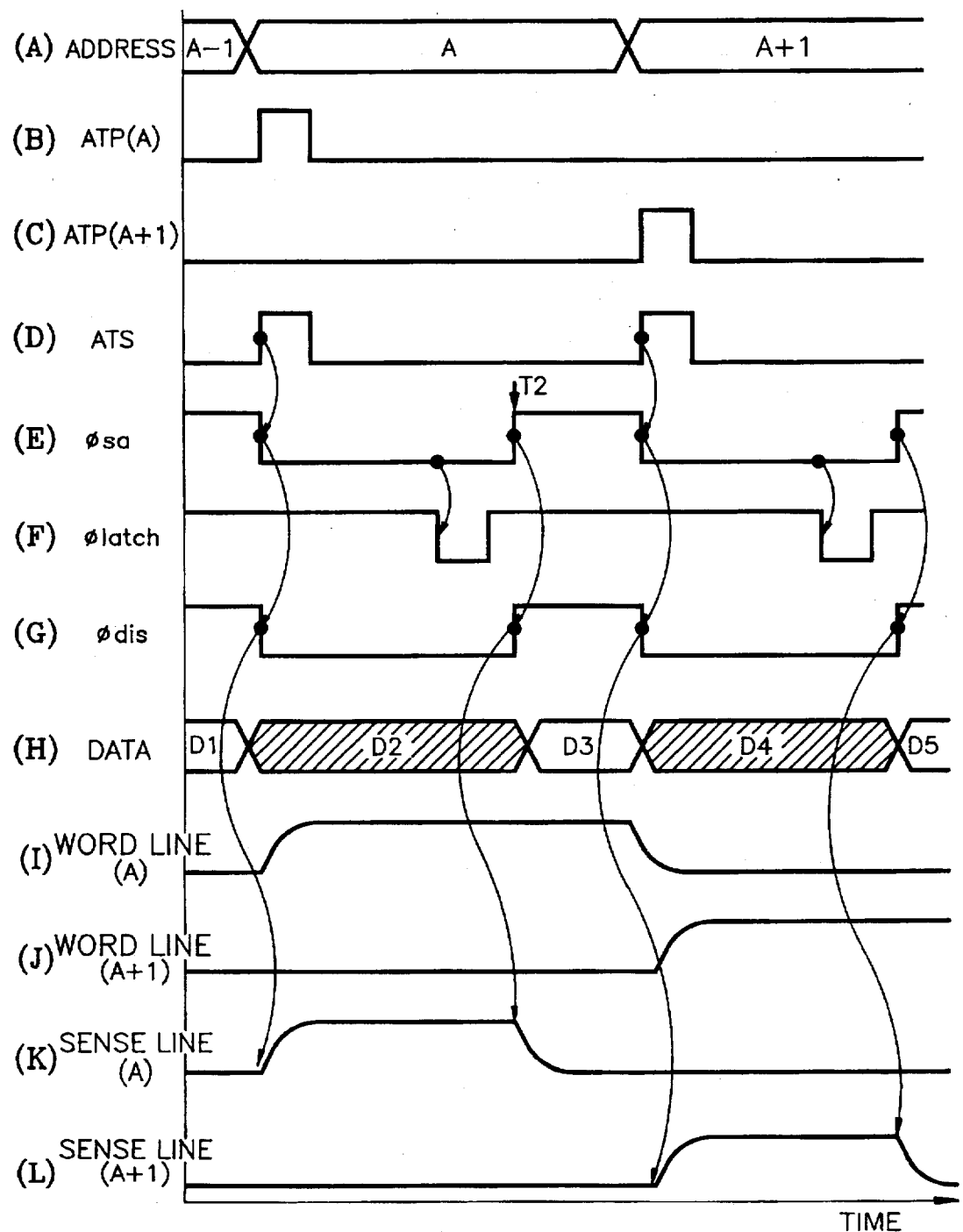
FIG. 4 is a timing diagram showing waveforms of various signals appearing in the EEPROM of FIG. 3.

As shown in FIGS. 3 and 4, the pulse generator 32 receives the ATS signal from the strobe generator 10 and generates the signals $\phi_{sa}$ and $\phi_{latch}$ shown by "E" and "F" of FIG. 4, which are applied to the sense amplifier 46 and the output buffer 48 respectively. The pulse generator 32 also generates signal $\phi_{dis}$, shown by "G" of FIG. 4, which is applied to reference voltage generator 34 and the gate of discharging transistor 36. The signal $\phi_{dis}$ is provided to intercept a reference voltage from the generator 34 to a sense line SL when a corresponding data is detected.

The drain of the discharging transistor 36 is connected to the source of the transfer transistor 38. Transfer transistor transmits the reference voltage to the gate of the memory transistor 42 through the sense line SL. A source of the discharging transistor 36 is connected to ground. The discharging transistor 36 is activated in response to signal $\phi_{dis}$ through the gate thereof and causes the sense line SL to discharge after data corresponding to a ground voltage address "A" is read out. Thus, the voltage signal shown by "K" of FIG. 4 is applied to the sense line SL when data stored in the corresponding memory transistor 42 is read out. At the completion of the read operation of the data, time T2, the signal $\phi_{dis}$ at a high level (shown by "G" of FIG. 4) is applied to the gate of the discharging transistor 36. The reference voltage maintained on the sense line SL is thus discharged through the source of the transistor 36 to the ground. This causes a ground voltage to appear on the sense line SL.

In this embodiment, the discharging transistor 36 is a single NMOS transistor, but other circuit elements for enabling the sense line SL to ground voltage are contemplated and such implementation would not depart from the scope of the present invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A non-volatile memory device capable of preventing erroneous read out of data, said memory device comprising:

a memory cell array including:

a plurality of bit lines arranged in parallel, a plurality of word lines electrically insulated from said plurality of bit lines, a plurality of sense lines electrically insulated from said plurality of bit lines and said plurality of word lines, and a plurality of memory cells, each memory cell connected to a corresponding bit line and including at least one memory transistor having a control gate connected with a corresponding sense line and a floating gate for storing electrical charge;

a reference voltage generating circuit that generates a reference voltage which is applied to a selected one of said sense lines selected when a data read out operation is performed on a selected memory cell; and a discharging circuit that discharges through a discharging path to a ground voltage level said reference voltage on said selected one of said sense lines when said data read out operation is complete, said discharging circuit including a discharging transistor having a gate controlled by a discharging signal and said discharging signal being generated by a pulse generator, said pulse generator also generating a sense amplifier activation signal and a latch signal.

2. A non-volatile memory device according to claim 1 wherein a selected one of said word lines remains activated for a period of time after said discharging signal is generated.

3. A non-volatile memory device capable of preventing erroneous read out of data, said memory device comprising:

a memory cell array including:

a plurality of bit lines arranged in parallel, a plurality of word lines electrically insulated from said plurality of bit lines, a plurality of sense lines electrically insulated from said plurality of bit lines and said plurality of word lines, and a plurality of memory cells, each memory cell connected to a corresponding bit line and including at least one memory transistor having a control gate connected with a corresponding sense line and a floating gate for storing electrical charge;

a control circuit for selecting one of said memory cells during a data read out operation, an associated one of said memory transistors being connected to a corresponding bit line during said data read out operation; and a voltage supplying circuit for providing a reference voltage to a selected one of said sense lines during a data read out operation, said voltage supplying circuit dropping said reference voltage on said selected sense line to a ground voltage when said data read out operation is complete;

wherein a selected one of said word lines remains activated for a period of time which is longer than said data read out operation.

4. The non-volatile memory device according to claim 3 wherein said voltage supplying circuit includes:

a reference voltage generating circuit that generates a reference voltage which is applied to said selected sense line during said data read out operation; and a ground voltage supplying circuit responsive to completion of said reading operation which generates a discharge signal that inhibits operation of said reference voltage generating circuit and initiates discharge of said selected sense line to said ground voltage.

5. A non-volatile memory device according to claim 4 wherein said ground voltage supplying circuit includes a discharging transistor having a gate controlled by said discharge signal.

6. A non-volatile memory device according to claim 4 wherein a selected one of said word lines remains activated for a period of time after said discharge signal is generated.

7. A non-volatile memory device according to claim 5 wherein a selected one of said word lines remains activated for a period of time after said discharge signal is generated.

8. A non-volatile memory device capable of preventing erroneous read out of data, said memory device comprising:

a memory cell array including:

a plurality of bit lines arranged in parallel, a plurality of word lines electrically insulated from said plurality of bit lines, a plurality of sense lines electrically insulated from said plurality of bit lines and said plurality of word lines, and a plurality of memory cells, each memory cell connected to a corresponding bit line and including at least one memory transistor having a control gate connected with a corresponding sense line and a floating gate for storing electrical charge;

a reference voltage generating circuit that generates a reference voltage which is applied to a selected one of said sense lines selected when a data read out operation is performed on a selected memory cell; and a discharging circuit that discharges through a discharging path to a ground voltage level said reference voltage on said selected one of said sense lines when said data read out operation is complete;

wherein a selected one of said word lines remains activated for a period of time which is larger than said data read out operation.

9. A non-volatile memory device according to claim 8 wherein said discharging circuit includes a discharging transistor having a gate controlled by a discharging signal.

* * * * *